(12) United States Patent
Lu

(10) Patent No.: US 12,426,252 B2
(45) Date of Patent: Sep. 23, 2025

(54) SEMICONDUCTOR STRUCTURE COMPRISING BURIED GATE STRUCTURE AND ISOLATION STRUCTURE WITH AIR GAP AND METHOD FOR MANUFACTURING SEMICONDUCTOR STRUCTURE

(71) Applicant: CHANGXIN MEMORY TECHNOLOGIES, INC., Hefei (CN)

(72) Inventor: Jingwen Lu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 573 days.

(21) Appl. No.: 17/807,579

(22) Filed: Jun. 17, 2022

(65) Prior Publication Data

US 2023/0078585 A1 Mar. 16, 2023

Related U.S. Application Data

(63) Continuation of application No. PCT/CN2021/130816, filed on Nov. 16, 2021.

(30) Foreign Application Priority Data

Sep. 13, 2021 (CN) .......................... 202111069551.X

(51) Int. Cl.
*H10B 12/00* (2023.01)

(52) U.S. Cl.
CPC ........... *H10B 12/34* (2023.02); *H10B 12/053* (2023.02)

(58) Field of Classification Search
CPC ...... H10B 12/02; H10B 12/053; H10B 12/34; H10B 12/488; H10B 12/315; H10B 12/485; H10B 12/482; H10B 12/0335; H10D 62/115; H10D 30/611; H10D 30/60; H10D 64/667; H10D 30/63; H10D 64/27; H10D 64/513; H01L 21/76224
USPC .................. 257/296; 438/238, 239, 386, 399
See application file for complete search history.

(56) References Cited

U.S. PATENT DOCUMENTS

| 9,484,335 B2 | 11/2016 | Cho |
| 10,396,073 B2 | 8/2019 | Feng |
| 10,424,586 B2 | 9/2019 | Yen |
| 10,431,679 B2 | 10/2019 | Chang |
| 2014/0061850 A1 | 3/2014 | Cho et al. |
| 2014/0175538 A1 | 6/2014 | Kang et al. |

(Continued)

FOREIGN PATENT DOCUMENTS

| CN | 104465354 A | 3/2015 |
| CN | 105576027 A | 5/2016 |

(Continued)

*Primary Examiner* — Didarul A Mazumder
(74) *Attorney, Agent, or Firm* — SYNCODA LLC; Feng Ma

(57) ABSTRACT

A method for manufacturing a semiconductor structure includes operations as follows. First mask pattern layers spaced apart on a base are formed. A first dielectric layer is deposited between the first mask pattern layers. The first dielectric layer is etched to form a first trench, the first trench exposing the base and a part of side walls of the first mask pattern layers. The base is etched to a first depth along the first trench, to expose the base under the first mask pattern layers. The base under the first mask pattern layers is etched to form gaps in the base.

10 Claims, 21 Drawing Sheets

(56) References Cited

U.S. PATENT DOCUMENTS

| | | | |
|---|---|---|---|
| 2015/0340453 A1* | 11/2015 | Cho | H10B 12/482 |
| | | | 257/330 |
| 2018/0197868 A1 | 7/2018 | Lin et al. | |
| 2018/0323190 A1 | 11/2018 | Feng et al. | |
| 2018/0342613 A1 | 11/2018 | Chang et al. | |
| 2018/0358362 A1* | 12/2018 | Yen | H10B 12/34 |
| 2019/0333913 A1 | 10/2019 | Feng et al. | |
| 2019/0341487 A1 | 11/2019 | Chang et al. | |
| 2021/0074334 A1 | 3/2021 | Zhu | |

FOREIGN PATENT DOCUMENTS

| | | | | |
|---|---|---|---|---|
| CN | 103855166 B | | 10/2016 | |
| CN | 111354726 A | | 6/2020 | |
| CN | 111564442 A | * | 8/2020 | H10B 12/02 |
| CN | 111900164 A | | 11/2020 | |
| CN | 113871343 A | | 12/2021 | |

* cited by examiner

SEMICONDUCTOR STRUCTURE COMPRISING BURIED GATE STRUCTURE AND ISOLATION STRUCTURE WITH AIR GAP AND METHOD FOR MANUFACTURING SEMICONDUCTOR STRUCTURE

CROSS-REFERENCE TO RELATED APPLICATIONS

This is a continuation of International Patent Application No. PCT/CN2021/130816 filed on Nov. 16, 2021, which claims priority to Chinese patent application No. 202111069551.X filed on Sep. 13, 2021. The disclosures of the above referenced applications are hereby incorporated by reference in their entirety.

BACKGROUND

When one row in a memory matrix is activated and is repeatedly refreshed, noise or interference is generated in a row adjacent to the one row. Before an adjacent cell is activated or refreshed, if an activation frequency of the row is excessively high, the adjacent cell become fragile, which results in problems of charge loss or leakage. Furthermore, errors occur in data of one or more cells in the adjacent row, and this phenomenon is referred to as the row hammer effect.

How to break a conductive path of interference charges, reduce the row hammer effect, and avoid mutual interference between different rows is a technical problem to be solved urgently in the art.

SUMMARY

This disclosure relates to the field of semiconductor technologies, and particularly to a semiconductor structure and a method for manufacturing the same.

An objective of this disclosure is to provide a semiconductor structure and a method for manufacturing the same. A gap is formed at the bottom of the manufactured semiconductor, to alleviate a hammer effect of the semiconductor structure.

A first aspect of some embodiments of this disclosure provides a method for manufacturing a semiconductor structure, which including the following operations. First mask pattern layers spaced apart are arranged on a base. A first dielectric layer is deposited between the first mask pattern layers. The first dielectric layer is etched to form a first trench where the base and a part of side walls of the first mask pattern layers are exposed. The base is etched to a first depth along the first trench to expose the base under the first mask pattern layers. The base under the first mask pattern layers is etched to form gaps in the base.

A second aspect according to some embodiments of this disclosure provides a semiconductor structure, including multiple active regions spaced from each other on a base, the active region. The active region includes a connection portion connected to a bit line, and an isolation structure is formed between the connection portion and the base.

DETAILED DESCRIPTION

To make the objectives, technical solutions and advantages of this disclosure clearer, this disclosure is described below in detail in conjunction with the specific implementations and with reference to the accompanying drawings. It should be understood that these descriptions are merely exemplary and are not intended to limit the scope of this disclosure. In addition, in the following descriptions, descriptions of well-known structures and technologies are omitted to avoid unnecessary obscuring of the concepts in this disclosure.

In the descriptions of this disclosure, it should be noted that the terms "first" and "second" are merely used for description, and cannot be understood as indicating or implying relative importance.

Figure 1A:
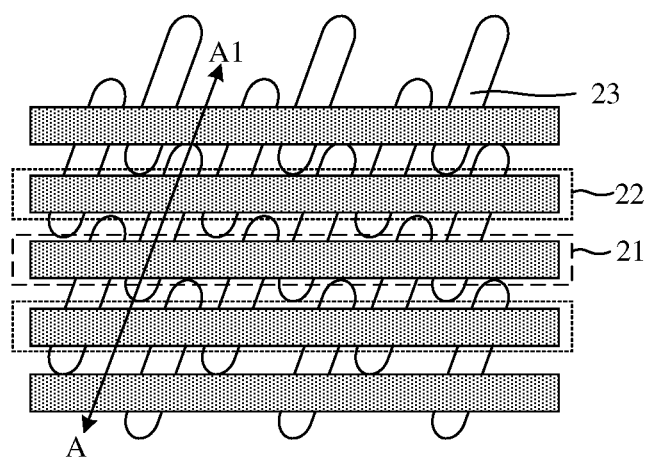
FIG. 1A is a top view of a semiconductor structure.
Figure 1B:
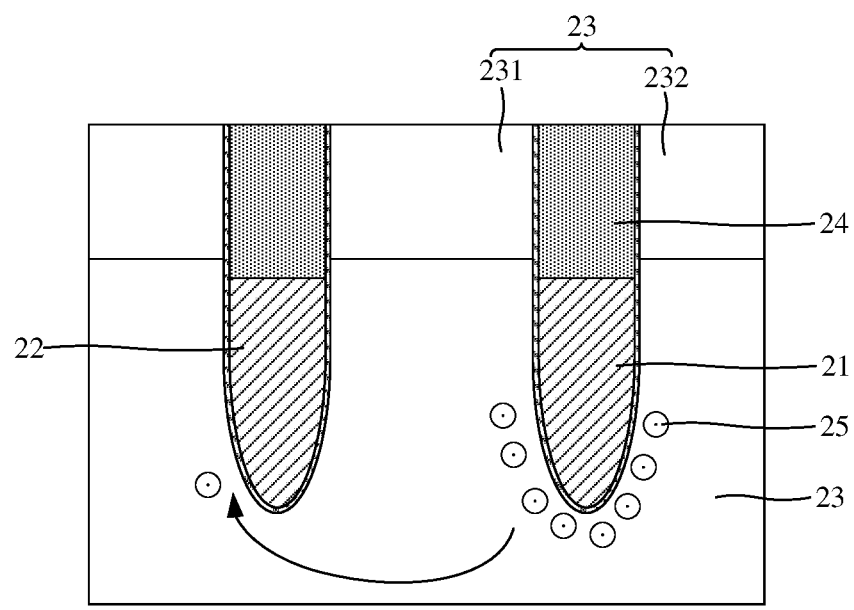
FIG. 1B is a partial cross-sectional view of FIG. 1A in a direction A-A1.

FIG. 1B is a partial cross-sectional view of FIG. 1A in a direction A-A1. Referring to FIG. 1A to FIG. 1B, a semiconductor structure includes a first word line 21 and a second word line 22 that are adjacent to each other. The top of the first word line 21 and the second word line 22 is provided with an insulating layer 24. A part of the first word line 21 and a part of the second word line 22 are buried in the same active region 23. Each active region 23 is provided with one first source/drain region 231 and two second source/drain regions 232. The second source/drain regions 232 are arranged at two ends of the active region 23, and the first source/drain region 231 is arranged between the two second source/drain regions 232. The first word line 21 buried in the active region 23, the second source/drain region 232 close to the first word line 21 and the first source/drain region 231 constitute a first transistor. The second word line 22 buried in the active region 23, the second source/drain region 232 close to the second word line 22 and the first source/drain region 231 constitute a second transistor. It should be noted that the first word line 21 buried in the active region 23 serves as a gate of the first transistor, and the second word line 22 buried in the active region 23 serves as a gate of the second transistor. It is not difficult to find that the first transistor and the second transistor share a first source/drain region 231. A first capacitor and a second capacitor electrically connected to the two second source/drain regions 232 respectively are formed subsequently. That is, the first transistor is configured to control the first capacitor, and the second transistor is configured to control the second capacitor.

When the first word line 21 is activated and is repeatedly refreshed, noise or interference is generated to the adjacent second word line 22. Specifically, referring to FIG. 1B, when the first word line 21 is refreshed, a conductive path is formed in the active region 23 under the first word line 21, and charges move through the conductive path. Because there is no isolation structure between the first word line 21 and the second word line 22 that are buried in the active region 23, and the first word line 21 and the second word line 22 are relatively close to each other, some charges may transfer from the active region 23 under the first word line 21 to the active region 23 under the second word line 22. Therefore, the second transistor is turned on, which causes problems of charge loss or leakage in the second capacitor. In other words, before the second capacitor is activated or refreshed, if the activation frequency of the first word line 21 is excessively high, the second capacitor becomes fragile, and then errors occur in the data of the second capacitor. This phenomenon is referred to as a row hammer effect.

Figure 2:
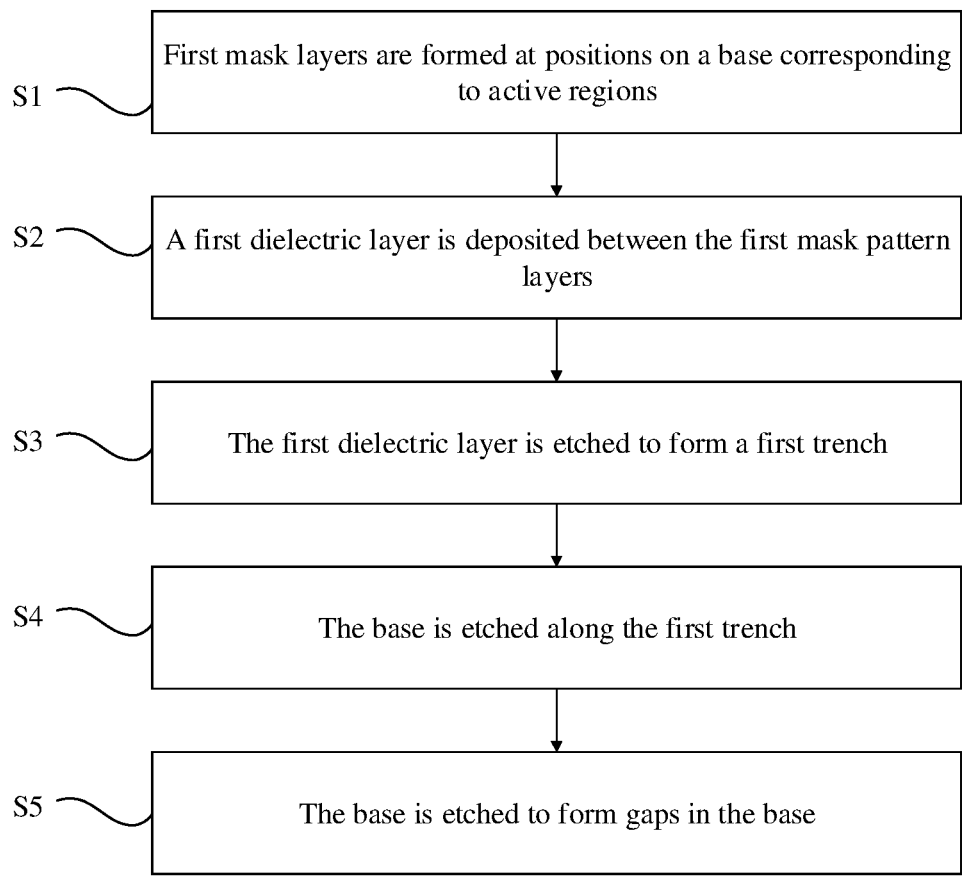
FIG. 2 exemplarily shows a process of manufacturing a semiconductor structure.

FIG. 2 is a schematic flowchart of manufacturing a semiconductor structure according to an embodiment of this disclosure.

A method for manufacturing a semiconductor structure is provided. With reference to FIG. 2, the method includes the following operations.

In S1, first mask pattern layers are formed at positions on a base corresponding to active regions.

In S2, a first dielectric layer is deposited between the first mask pattern layers.

In S3, the first dielectric layer is etched to form a first trench.

In S4, the base is etched along the first trench.

In S5, the base is etched to form a gap in the base.

In S1 of the embodiment, first mask pattern layers 2 spaced apart are formed on a base 1. The first mask pattern layers 2 are configured to define active regions on the base, and the first mask pattern layers 2 may be formed in any existing manner.

Figure 3A:
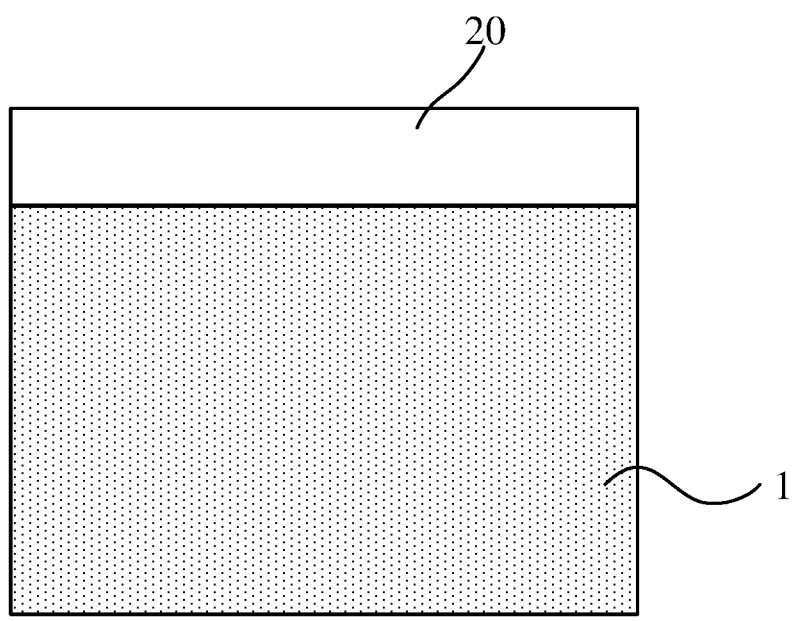
FIG. 3A is a schematic diagram of forming a first mask layer on a base.
Figure 3B:
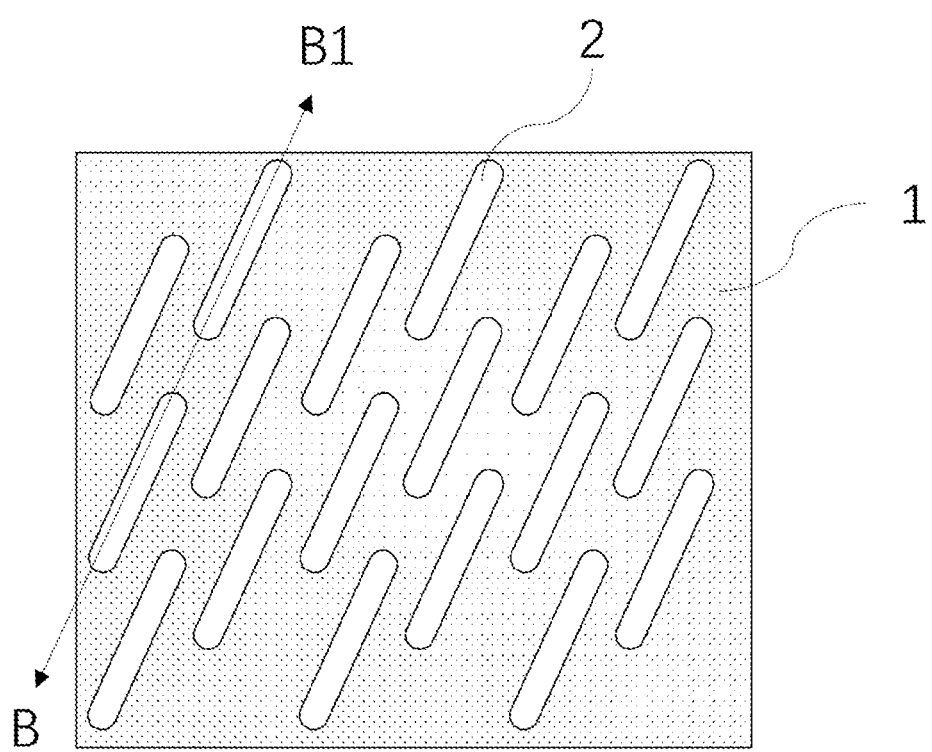
FIG. 3B is a schematic top view of forming first mask pattern layers on the base.
Figure 3C:
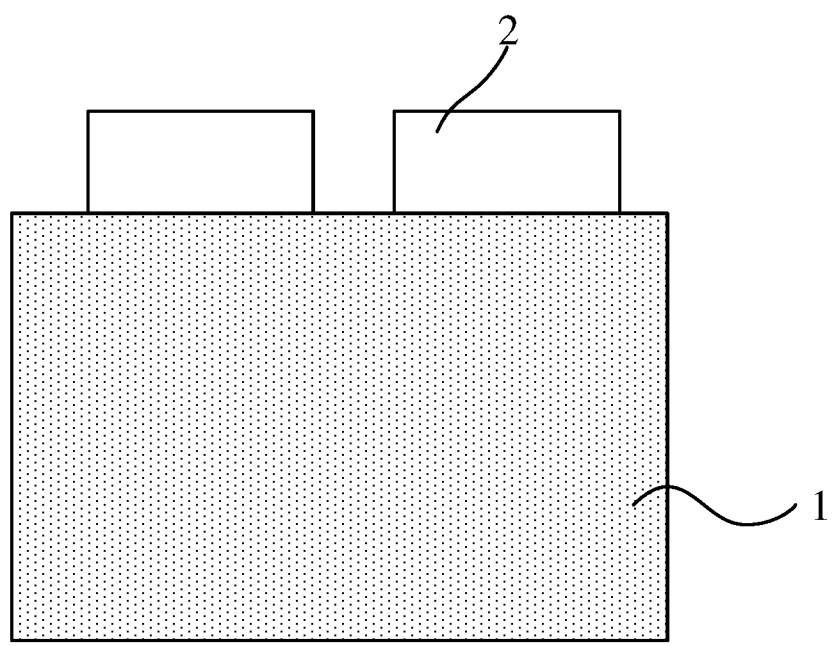
FIG. 3C is a partial cross-sectional view of FIG. 3B in a direction B-B1.

FIG. 3A is a schematic diagram of forming a first mask layer on a base. Referring to FIG. 3A, in an embodiment, a process of forming the first mask pattern layers 2 includes operations as follows. A first mask layer 20 is deposited on the base 1, the first mask layer 20 may be polysilicon. The first mask layer 20 is etched to form first mask pattern layers 2 as shown in FIG. 3B and FIG. 3C. FIG. 3B is a schematic top view of forming first mask pattern layers on the base. FIG. 3C is a partial cross-sectional view of FIG. 3B in a direction B-B1.

Figure 3D:
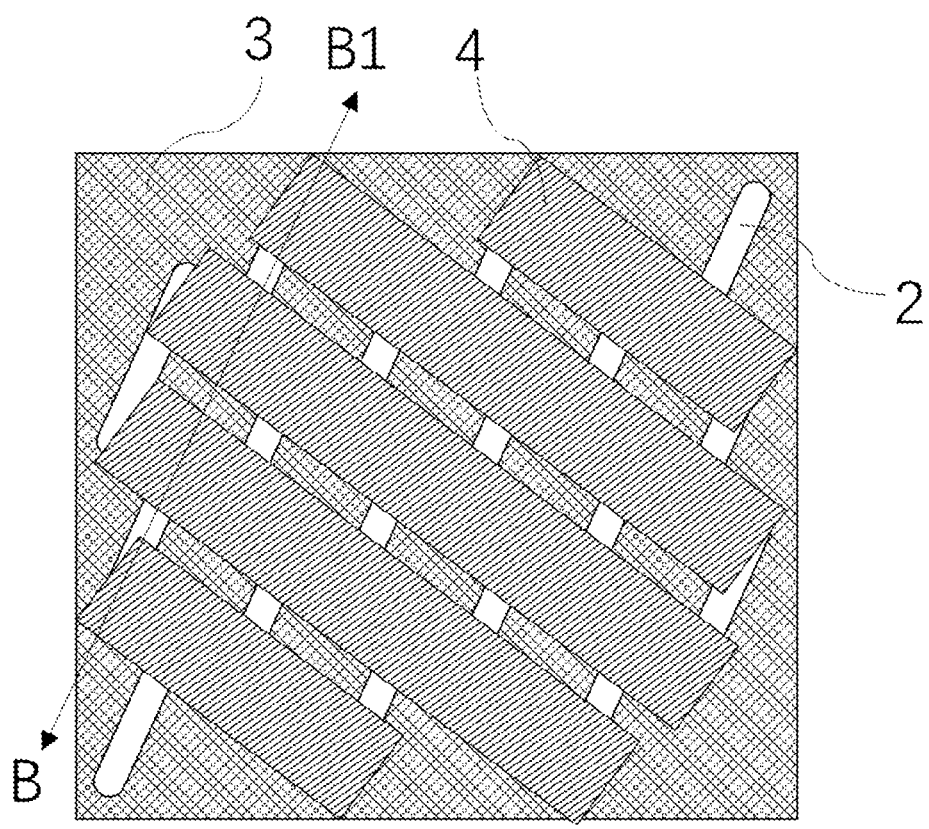
FIG. 3D is a schematic top view of depositing a first dielectric layer in a gap between the first mask pattern layers, and covering a surface of the first dielectric layer with second mask pattern layers.
Figure 3E:
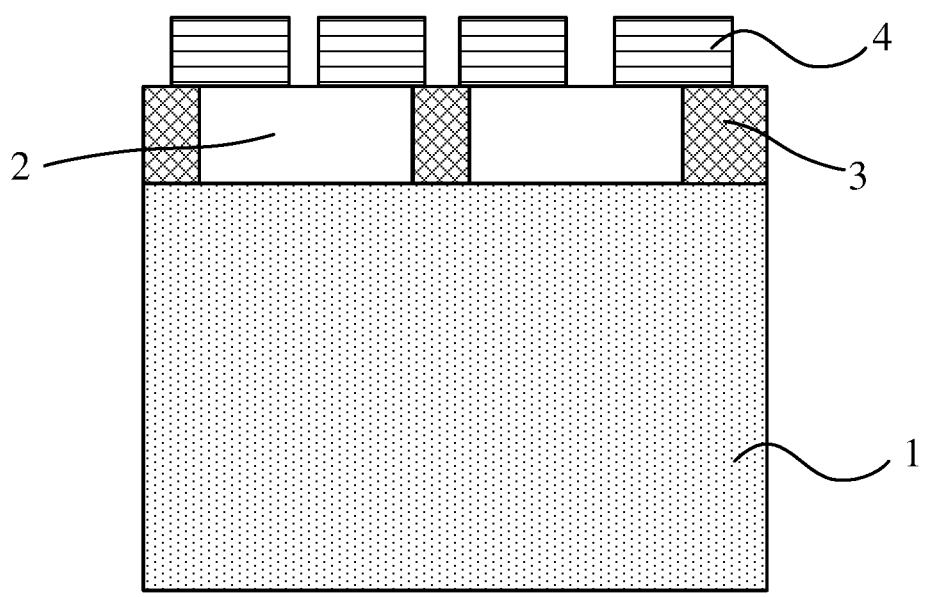
FIG. 3E is a partial cross-sectional view of FIG. 3D in a direction B-B1.
Figure 3F:
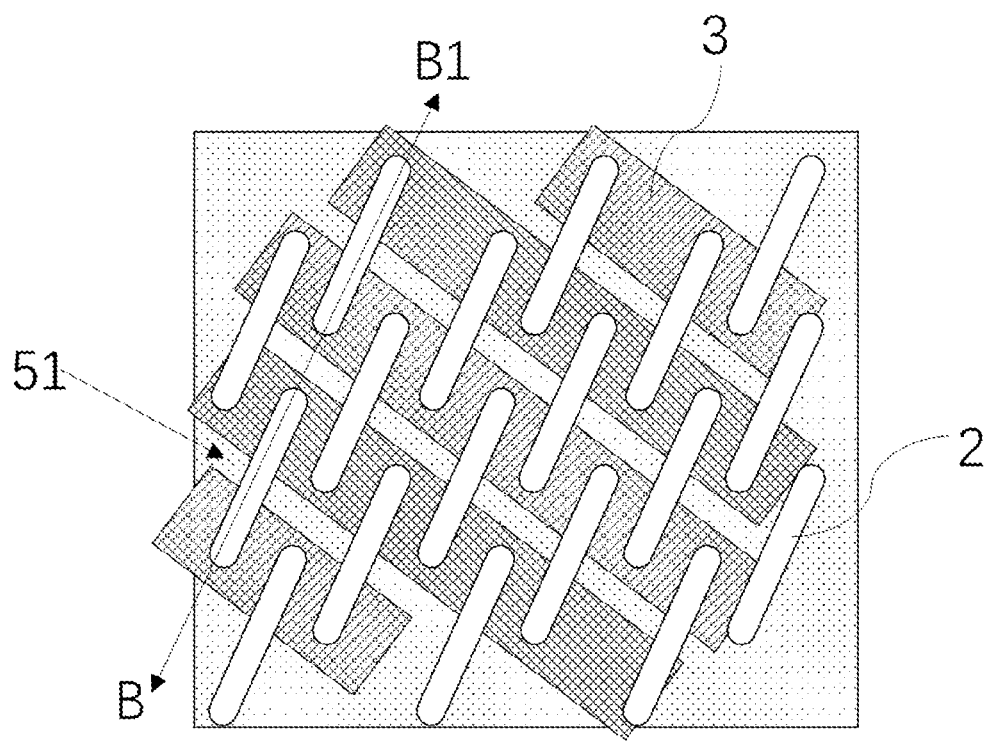
FIG. 3F is a schematic top view of etching downward in a direction perpendicular to the second mask pattern layers to remove photoresist.
Figure 3G:
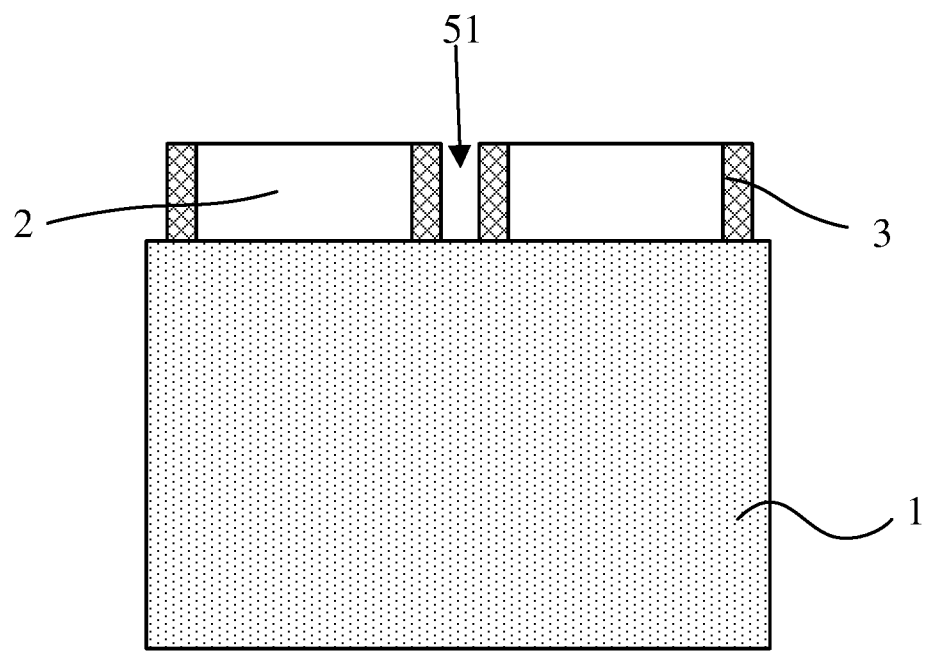
FIG. 3G is a partial cross-sectional view of FIG. 3F in a direction B-B1.
Figure 4A:
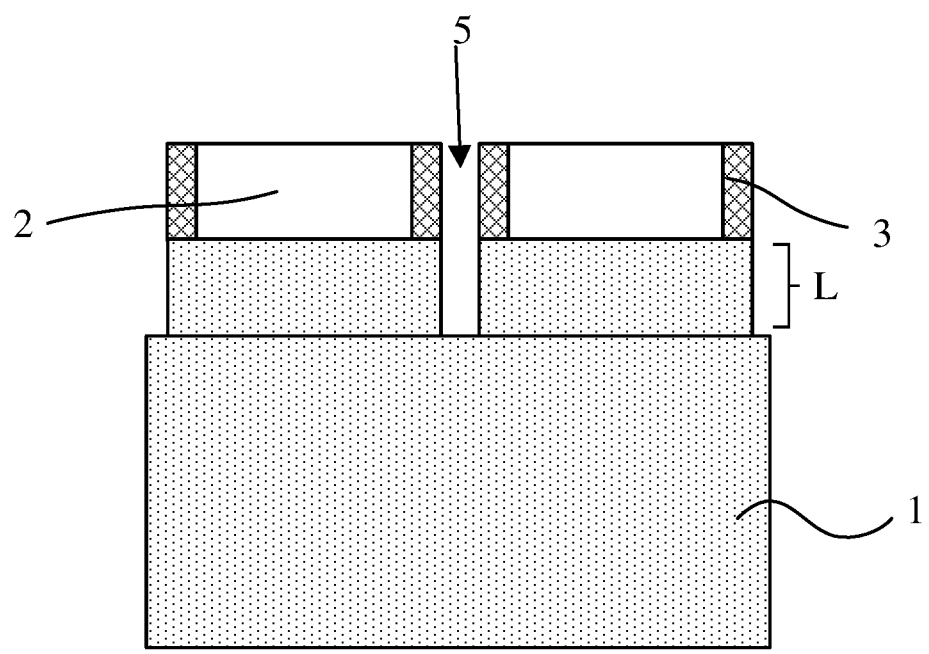
FIG. 4A is a schematic structural diagram after continuing etching part of the base shown in FIG. 3G.

In S2 and S3, FIG. 3 and FIG. 4A are a process of forming a first trench 5 in an embodiment, and schematically show depositing a first dielectric layer 3 between the first mask pattern layers 2, and etching the first dielectric layer 3 to form the first trench 5. The first trench 5 exposes the base 1 and a part of side walls of the first mask pattern layers 2. FIG. 3C is a schematic diagram of depositing a first dielectric layer 3 between the first mask pattern layers 2.

Second mask pattern layers 4 are formed on the first dielectric layer 3 and the first mask pattern layers 2. The second mask pattern layers 4 may be photoresist, and the second mask pattern layers 4 may be in a spaced structure along a second direction. A gap in the structure exposes a part of the first mask pattern layer 2. In an embodiment, an arrangement direction of the second mask pattern layers 4 may have a certain angle relative to an arrangement direction of the first mask pattern layers 2, for example, an included angle of 90°. In another embodiment, the second mask pattern layer 4 expose the middle portion of the first mask pattern layer 2. Referring to FIG. 3D and FIG. 3E for details, FIG. 3D is a schematic top view of depositing a first dielectric layer 3 in each gap between the first mask pattern layers 2, and covering a surface of the first dielectric layer 3 with the second mask pattern layer 4, and FIG. 3E is a partial cross-sectional view of FIG. 3D in a direction B-B1.

In an embodiment, with reference to FIG. 3F, FIG. 3G and FIG. 4A, after the second mask pattern layer 4 is formed, the second mask pattern layer 4 is etched downward to form a first trench 5. FIG. 3F is a schematic top view of etching downward in a direction perpendicular to the second mask pattern layer 4 to remove photoresist, FIG. 3G is a partial cross-sectional view of FIG. 3F in a direction B-B1, and FIG. 4A is a schematic structural diagram of continuing etching a part of the base as shown in FIG. 3G.

In an embodiment, the etching the first dielectric layer 3 to form the first trench 5 includes operations as follows. A second mask layer on surfaces of the first mask pattern layers 2 is deposited. The second mask layer is patterned to form second mask pattern layers 4. The second mask pattern layers 4 expose target regions on the first mask pattern layers 2. The first dielectric layer 3 is etched along the first mask pattern layer 2, to form initial first trenches 51 that expose side walls in the target regions. The initial first trenches 51 may be, for example, several rectangular holes. A part of the base 6 is etched to extend the initial first trench 51 to form the first trench 5.

In an embodiment, the initial first trench 51 extends along the base 1 to a second depth L, a ratio of the second depth L to a first depth H ranges from 0.2 to 0.5.

In an embodiment, the target region defines a region at a position in contact with the bit line. Referring to FIG. 1A and FIG. 3, the target region on the first mask pattern layer 2 is a region which is in contact with the bit line and the bit line passes through.

Exemplarily, the second mask layer and the second mask pattern layers 4 are photoresist layers, and the material thereof is polyurethane (PR). Exemplarily, a process of patterning the second mask layer to form the second mask pattern layers 4 includes: coating photoresist on the first dielectric layer 3 and the first mask pattern layers 2, to form the second mask pattern layers 4 after exposing and developing.

In an embodiment, the first dielectric layer 3 is formed by using the atomic layer deposition (ALD) method, and the reactive gas is a mixture gas of NH3 or N2 or H2 reactive gas. Exemplarily, after the reactive gas is ionized into plasma, nitrogen ions in the plasma react with silane adsorbed on the base 1, and the reactants are deposited as the first dielectric layer 3. Exemplarily, the material of the first dielectric layer 3 is a hard mask layer SiN.

In an embodiment, referring to FIG. 4A, after the first trench 5 is formed, the second mask pattern layers 4 are removed. Exemplarily, the second mask pattern layers 4 are photoresist layers, and the photoresist layers are removed through dry or wet etching.

Figure 4B:
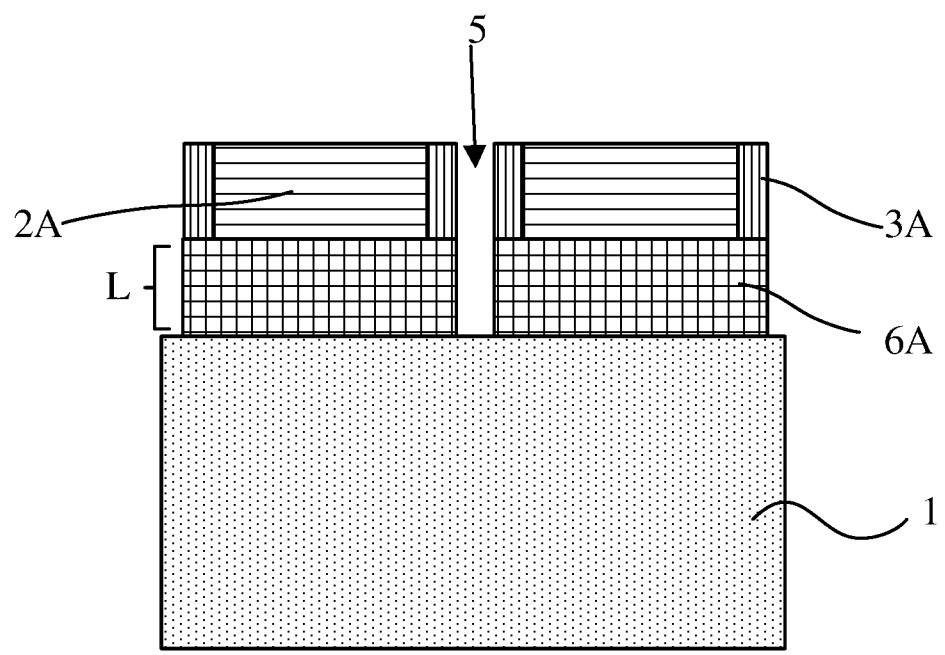
FIG. 4B is a schematic structural diagram after performing oxidation in FIG. 4A.
Figure 4C:
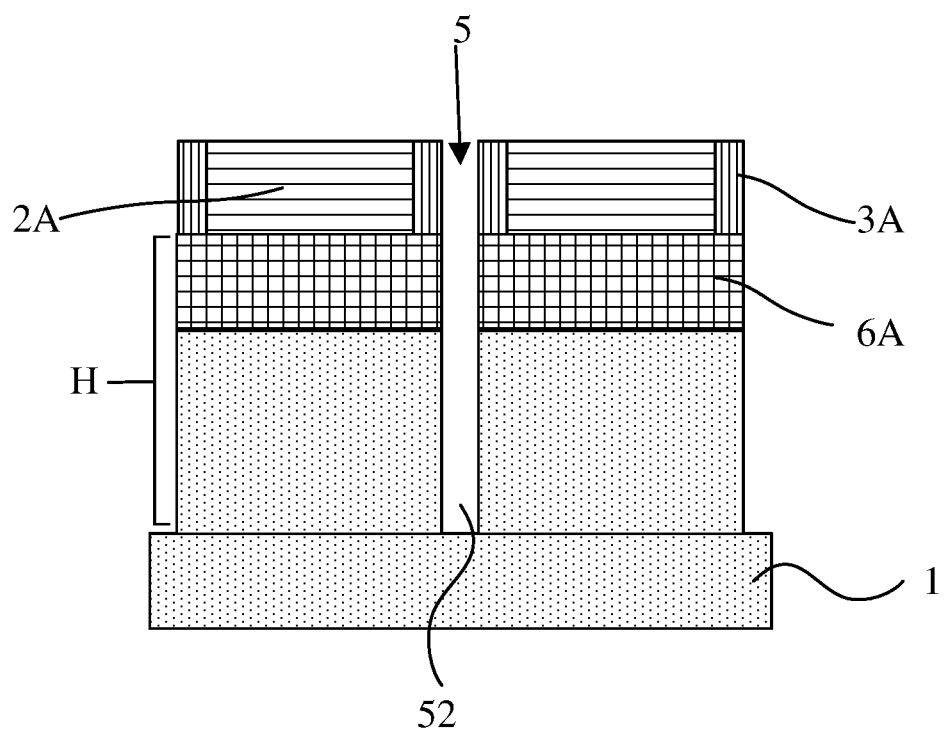
FIG. 4C is a schematic structural diagram after etching to the first depth H in FIG. 4B.

In S4, the base is etched along the first trench. Specifically, the base 1 is etched to the first depth H along the first trench 5, to expose the base 1 under the first mask pattern layers 2. Referring to FIG. 4, FIG. 4A to FIG. 4C exemplarily show a schematic diagram of oxidation and forming a first depth H. FIG. 4A is a schematic structural diagram of continuing etching a part of the base as shown in FIG. 3G, FIG. 4B is a schematic structural diagram after performing oxidation in FIG. 4A, and FIG. 4C is a schematic structural diagram after etching to the first depth H in FIG. 4B.

In some embodiments, with reference to FIG. 4B, before the etching the base 1 along the first trench 5 in S4, the method further includes an oxidation operation, and the oxidation operation includes operations as follows. Oxidation treatment is performed on the first mask pattern layers 2, the exposed part of the base 6 and the first dielectric layer 3, to form first oxidation layer 2A on surfaces of the first mask pattern layers 2, to form second oxidation layer 6A on a surface of the base, and to form third oxidation layer 3A on a surface of the first dielectric layer.

In an embodiment, the materials of the first oxidation layer 2A and the second oxidation layer 6A include silicon oxide, and the material of the third oxidation layer 3A includes nitrogen-containing silicon oxide. Exemplarily, the material of the first mask pattern layers 2 is polysilicon (Poly), the material of the first dielectric layer 3 is silicon nitride ($Si_3N_4$), and the material of the base 1 is monocrystalline silicon. Poly is oxidized to form $SiO_2$, the base is oxidized to form $SiO_2$, and $Si_3N_4$ is oxidized to form silicon oxynitride ($SiO_xN_y$). With reference to FIG. 4B, the exposed surfaces of the first mask pattern layers 2 are oxidized to form $SiO_2$ layers 2A, the surface of the first dielectric layer 3 and surfaces of the first trench 5 are oxidized to form $SiO_xN_y$ layers 3A, and the etched part of the surface of the base 6 and the surface of the first trench 5 are oxidized to form $SiO_2$ layers 6A, and both inside and outside of the first trench 5 are oxidized.

In an embodiment, energy intensity of the plasma of the oxidation ranges from 600 W to 2000 W, a temperature of the oxidation ranges 800° C. to 1000° C., and the oxidizing gas is oxygen.

In an embodiment, one or a combination of $SF_6$, $CF_4$, $Cl_2$, $CHF_3$, $O_2$ and Ar is used as gases for etching the material Si, Poly or $SiO_2$. Exemplarily, a part of the base 6, the base 1, the first oxidation layer 2A and the second oxidation layer 6A are dry-etched by using these gases.

In an embodiment, with reference to FIG. 4C, etching downward continues to be performed along the first trench 5 to the first depth H to form a second trench 52.

In some embodiments, the height of etching the part of the base 6, that is, the second depth L, is 20% to 30% of the first depth H. Correspondingly, in S4, etching downward continues to be performed along the first trench 5 to 70%-80% of the first depth H. In this case, the second trench 52 is formed by a section from the first trench 5 to the first depth H.

In S5, the base is etched to form a gap in the base. Specifically, the base 1 under the first mask pattern layer 2 is etched, to form a gap 8 in the base. Exemplarily, the formed gap 8 is shown in FIG. 5A.

Figure 5A:
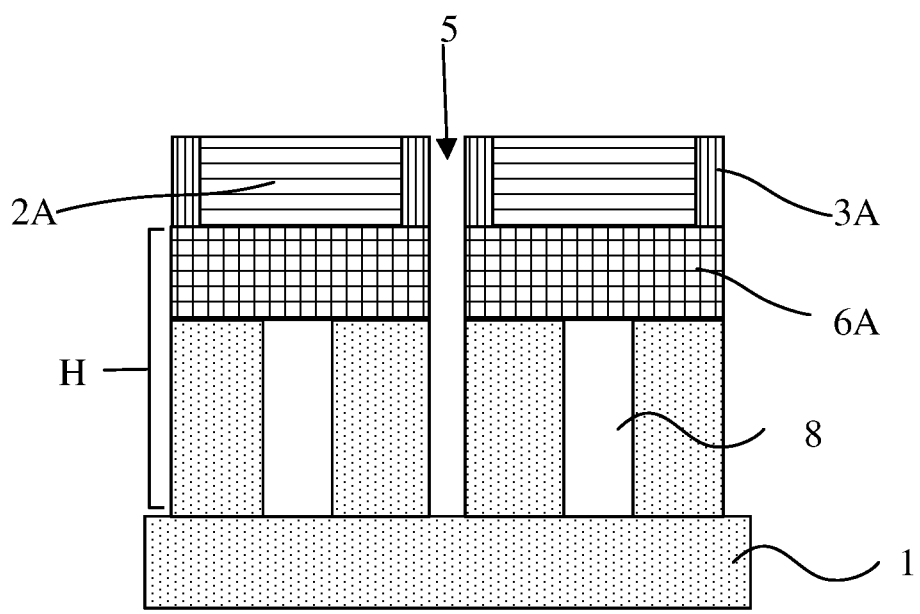
FIG. 5A is a schematic structural diagram after the gaps are formed in FIG. 4C.
Figure 5B:
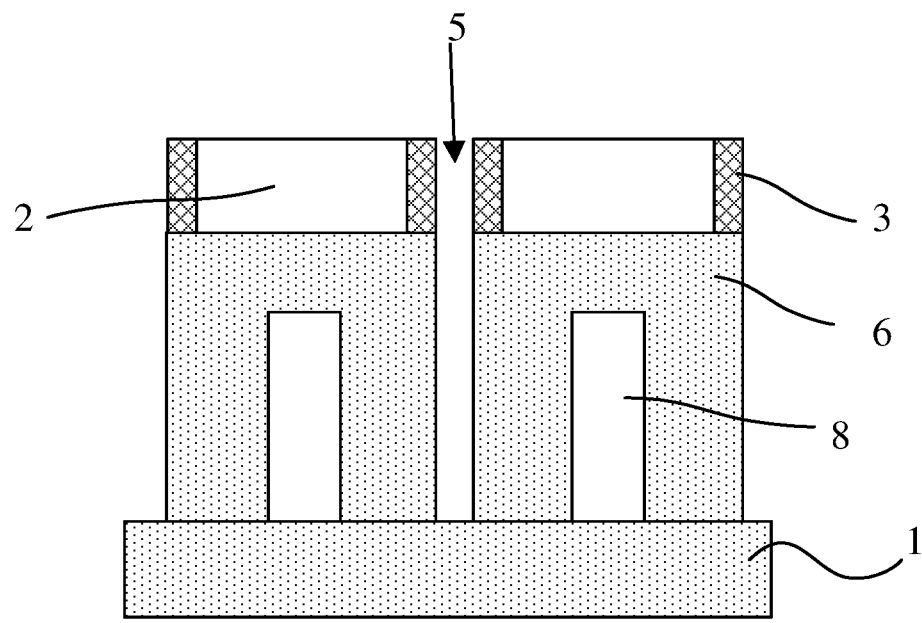
FIG. 5B shows a schematic structural diagram after the oxidation layers in FIG. 5A are removed.
Figure 5C:
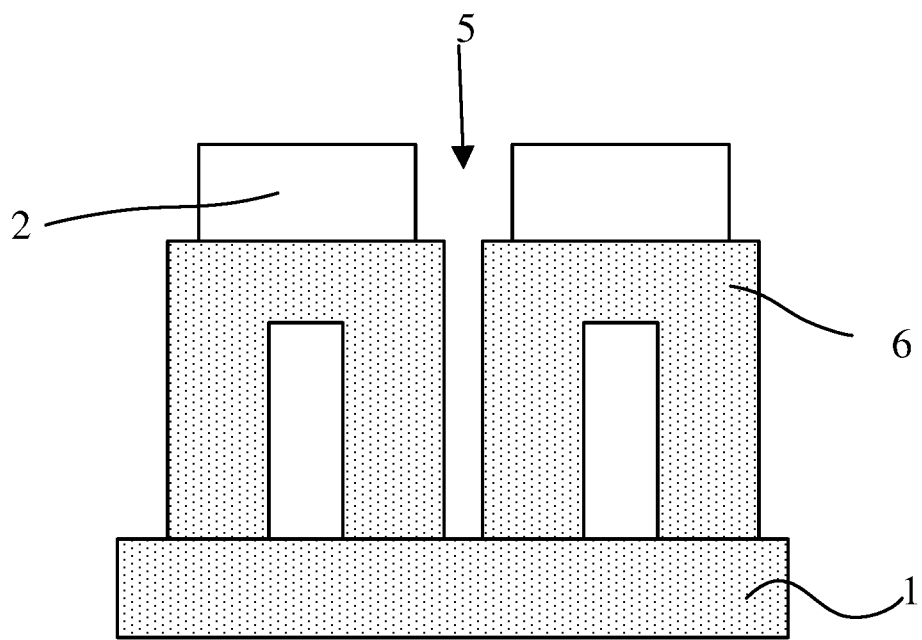
FIG. 5C shows a schematic structural diagram after the first dielectric layer in FIG. 5B is removed.

FIG. 5A to FIG. 5C exemplarily show a schematic diagram of forming the gap and removing the oxidation layers and the first dielectric layer. FIG. 5A is a schematic structural diagram after the gaps are formed in FIG. 4C, FIG. 5B shows a schematic structural diagram after the oxidation layers in FIG. 5A are removed, and FIG. 5C shows a schematic structural diagram after the first dielectric layer in FIG. 5B is removed.

In some embodiments, the operation of forming the gap 8 includes operations as follows. With using the first oxidation layer 2A, the second oxidation layer 6A and the third oxidation layer 3A as an etching mask, the base 1 exposed under the first mask pattern layer 2 is etched at an oblique angle in a direction parallel to the base 1, to form the gap 8 under the first mask pattern layer 2. Exemplarily, the material Si of the base 1 is etched at the oblique angle while the materials $SiO_xN_y$ and $SiO_2$ are not etched, and the material Si of the base 1 is etched to the first depth H. Because the first oxidation layer 2A, the second oxidation layer 6A and the third oxidation layer 3A are not etched, the portion higher than the second depth L is not etched, and the height of the gap 8 is obtained by subtracting the second depth L from the first depth H. For example, the height of the gap 8 is 70%-80% of H. In addition, side walls of the first trench 5 are all oxidized, and the side walls of the first trench 5 are also not etched.

It should be noted that, in addition to using the first oxidation layer 2A, the second oxidation layer 6A and the third oxidation layer 3A as the etching mask, the etching mask may be formed in other forms to form the gap 8 by etching. For example, the etching mask may be formed by a deposition process instead of an oxidation process.

Referring to FIG. 5A, after the gap 8 is formed, the semiconductor structure has an inverted concave structure, and the inverted concave structure may be used to form a buried word line. The gap 8 is formed between a group of adjacent buried word lines, to block transferring of charges between adjacent word lines, thereby reducing noise or interference inside the semiconductor structure, and improving the accuracy of data stored in the semiconductor.

In some embodiments, after the gap 8 is formed, with reference to FIG. 5, the method includes: as shown in FIG. 5B, removing the oxidation layer 3A formed by the first dielectric layer 3, and removing the oxidation layer 6A formed by a part of the base 6.

In an embodiment, HF liquid, $H_3PO_4$ liquid and water are used for cleaning to wash off $SiO_xN_y$ layers outside the first dielectric layer 3, and remove the first dielectric layer 3, and retain the first mask pattern layer 2. Exemplarily, the first dielectric layer 3 is removed by using an etching process.

In an embodiment, HF liquid, $H_3PO_4$ liquid, and water are used for cleaning, to remove the $SiO_2$ layers.

Figure 6A:
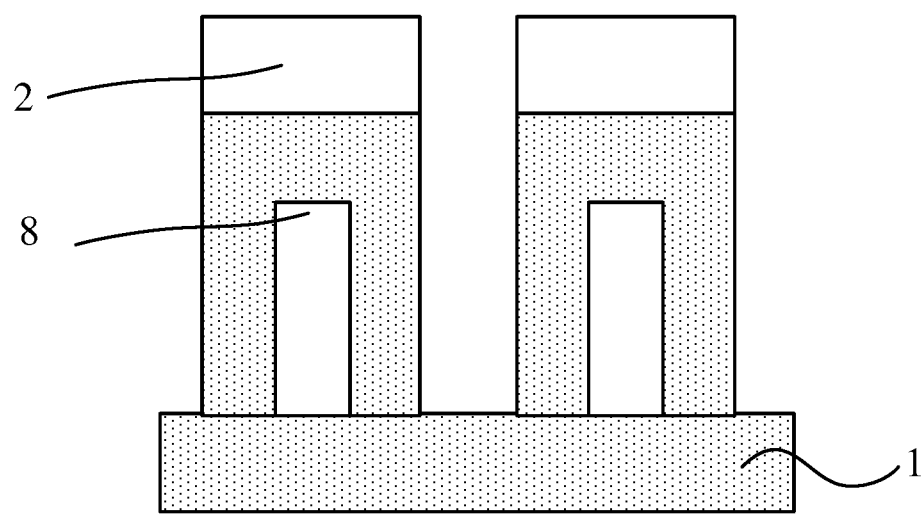
FIG. 6A is a schematic structural diagram after the base in the first depth within a range outside the cover of the first mask pattern layers in FIG. 5C is removed.
Figure 6B:
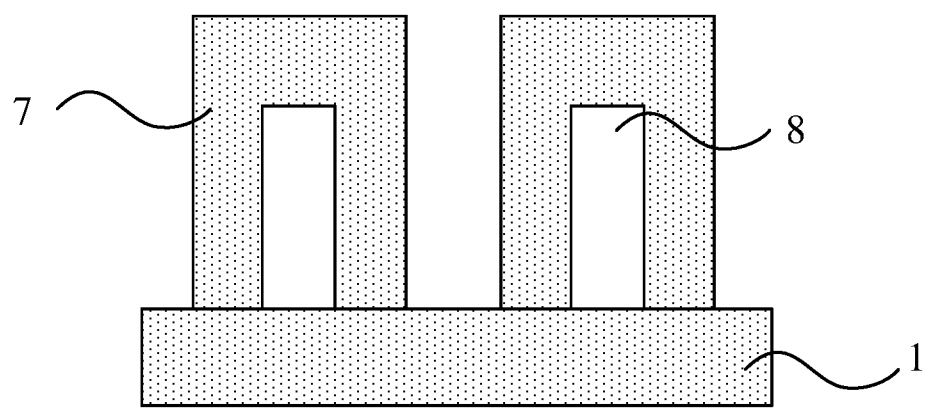
FIG. 6B is a schematic structural diagram after the first mask pattern layers in FIG. 6A are removed.

In some embodiments, after the gap 8 is formed, the method further includes operations as follows. As shown in FIG. 5C, the first dielectric layer 3 is removed. The base 1 is etched to the first depth H by using the first mask pattern layer 2 as an etching mask. The first mask pattern layer 2 is removed to form an active region 7. Exemplarily, as shown in FIG. 6A, the base at the first depth H within a range outside the cover of the first mask pattern layer 2 is removed, that is, the first mask pattern layer 2 is used as a mask to etch redundant Si downward. As shown in FIG. 6B, the first mask pattern layer 2 is removed to form the active region 7, and the height of the active region 7 is the first depth H. It should be noted that, after the gap 8 is formed, the gap 8 in the middle of the word line buried in the active region 7 is used for isolating the word lines.

Figure 6C:
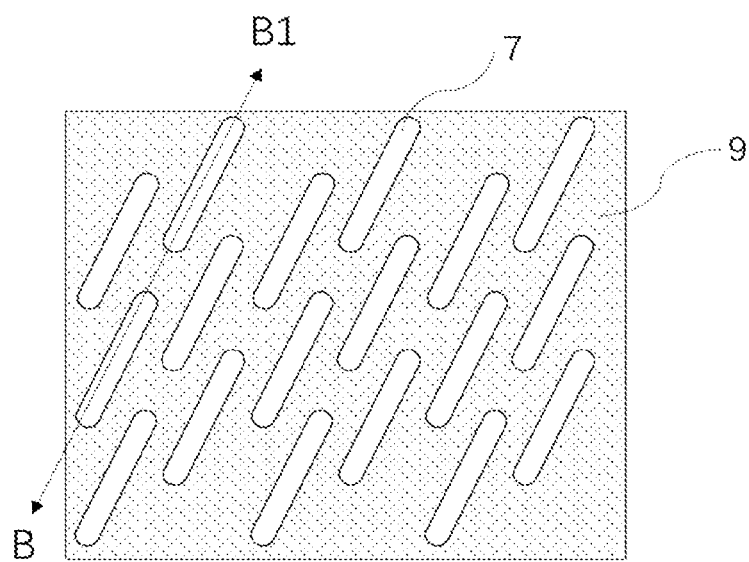
FIG. 6C is a schematic top view of the semiconductor structure after the isolation layer is filled.
Figure 6D:
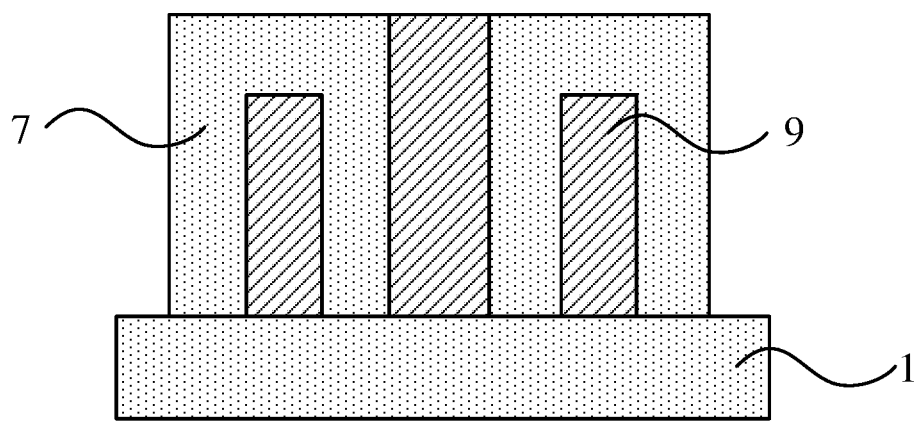
FIG. 6D is a partial cross-sectional view of FIG. 6C in a direction B-B1.

FIG. 6A to FIG. 6D exemplarily show a schematic diagram of removing the first mask pattern layers and depositing an isolation layer. FIG. 6A is a schematic structural diagram after the base in the first depth within a range outside the cover of the first mask pattern layers in FIG. 5C is removed, FIG. 6B is a schematic structural diagram after the first mask pattern layers in FIG. 6A are removed, FIG. 6C is a schematic top view of the semiconductor structure after the isolation layer is filled, and FIG. 6D is a partial cross-sectional view of FIG. 6C in a direction B-B1.

In an embodiment, referring to FIG. 6C and FIG. 6D, after the active regions 7 of the semiconductor structure are formed, an isolation layer 9 is filled between the active regions 7. The material of the isolation layer 9 is an insulating material, which may be, for example, silicon oxide, silicon oxycarbide or silicon nitride.

In an embodiment, a part of the isolation layer 9 is formed in the gap 8.

In an embodiment, when the gap is not full of the isolation layer 9, an air gap exists in the gap 8. The gap 8 is filled with the isolation layer 9, which avoids mutual interference between two word lines on the same active region 7, and reduces the influence of the row hammer effect.

In an embodiment, the operation of forming the isolation layer 9 between the active regions 7 and forming the isolation layer in the gap 8 includes operations as follows. $SiO_2$ is deposited in a low pressure chemical vapor deposition (LPCVD) manner. A reaction temperature ranges from 600° C. to 700° C., and a gas pressure ranges from 0.1 Torr to 1 Torr.

Figure 7:
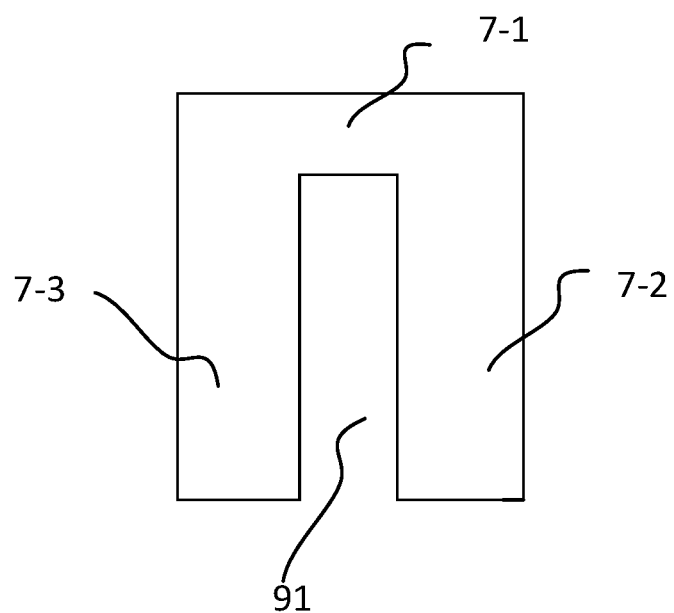
FIG. 7 exemplarily shows a schematic diagram of an active region of a semiconductor structure.

FIG. 7 exemplarily shows the structure of the active region, in which the isolation layer is not shown.

With reference to FIG. 7, several active regions 7 spaced apart from each other are formed on the base 1 of the semiconductor structure. The active region 7 includes a connection portion 7-1 connected to a bit line, an isolation structure 91 is formed between the connection portion 7-1 and the base 1. The isolation structure 91 is formed between a first support portion 7-3 and a second support portion 7-2, and is used for isolation, to block the transferring of charges, thereby reducing noise or interference inside the semiconductor structure.

In an embodiment, referring to FIG. 7, the active region includes the first support portion 7-3 and the second support portion 7-2, both ends of the connection portion 7-1 are connected to the base 1 through the first support portion 7-3 and the second support portion 7-2 respectively, and the isolation structure 91 is formed between the first support portion 7-3 and the second support portion 7-2.

In an embodiment, the isolation structure 91 runs through the active region along a width direction of the active region 7, and a height of the isolation structure ranges from 70% to 80% of a height of the active region.

In an embodiment, an air gap exists in the isolation structure 91. Exemplarily, a filling material in the isolation structure 91 may be silicon oxide, silicon oxycarbide, silicon nitride or the like. When the isolation structure 91 is not full of the filling material, an air gap exists in the isolation structure 91.

In an embodiment, a buried word line structure is formed in the first support portion 7-3 and the second support portion 7-2. The isolation structure 91 is formed between the buried word lines to block the transferring of charges between the word lines, thereby improving the accuracy of data stored in the semiconductor.

In an embodiment, a top surface of the isolation structure 91 is higher than a top surface of the buried word line structure. Therefore, the transferring of charges between the word lines is further blocked, thereby improving the accuracy of the data stored in the semiconductor.

In an embodiment, the material of the active region 7 is the same as that of the base, which is Si.

It should be understood that the foregoing specific embodiments of this disclosure are merely used to exemplarily illustrate or explain the principles of this disclosure, and do not constitute a limitation to this disclosure. Therefore, any modifications, equivalent replacements, improvements, and the like made without departing from the spirit and scope of this disclosure shall fall within the protection scope of this disclosure. In addition, the appended claims of this disclosure are intended to cover all changes and modifications that fall within the scope and boundaries of the appended claims, or the equivalent forms of such scope and boundaries.

What is claimed is:

1. A method for manufacturing a semiconductor structure, comprising:
   forming first mask pattern layers spaced apart on a base;
   depositing a first dielectric layer between the first mask pattern layers;
   etching the first dielectric layer to form a first trench, wherein the first trench exposes the base and a part of side walls of the first mask pattern layers;
   etching the base to a first depth along the first trench to expose the base under the first mask pattern layers; and
   etching the base under the first mask pattern layers to form gaps in the base.

2. The method for manufacturing the semiconductor structure according to claim 1, wherein
   etching the first dielectric layer to form the first trench comprises:
   depositing a second mask layer on surfaces of the first mask pattern layers;
   patterning the second mask layer to form second mask pattern layers, wherein the second mask pattern layers expose target regions on the first mask pattern layers;
   etching the first dielectric layer along the first mask pattern layers to form an initial first trench that exposes side walls of the target regions; and
   etching a part of the base to extend the initial first trench; to form the first trench.

3. The method for manufacturing the semiconductor structure according to claim 2, wherein
   the initial first trench extends along the base to a second depth, and a ratio of the second depth to the first depth ranges from 0.2 to 0.5.

4. The method for manufacturing the semiconductor structure according to claim 2, wherein
   the target regions are defined by regions in contact with bit lines.

5. The method for manufacturing the semiconductor structure according to claim 1, further comprising:
   before etching the base along the first trench,
   performing oxidation treatment on the first mask pattern layers, the exposed base and the first dielectric layer to form a first oxidation layer on surfaces of the first mask pattern layers, to form a second oxidation layer on a surface of the base, and to form a third oxidation layer on a surface of the first dielectric layer.

6. The method for manufacturing the semiconductor structure according to claim 5, wherein
   a material of the first oxidation layer and the second oxidation layer comprises silicon oxide, and a material of the third oxidation layer comprises nitrogen-containing silicon oxide.

7. The method for manufacturing the semiconductor structure according to claim 5, wherein
   the gaps are formed by:
   etching, by using the first oxidation layer, the second oxidation layer and the third oxidation layer as an etching mask, the base exposed under the first mask pattern layers at an oblique angle in a direction parallel to the base, to form the gaps under the first mask pattern layers.

8. The method for manufacturing the semiconductor structure according to claim 1, further comprising:
   after forming the gaps,
   removing the first dielectric layer;
   etching the base to the first depth by using the first mask pattern layers as an etching mask; and
   removing the first mask pattern layers to form active regions.

9. The method for manufacturing the semiconductor structure according to claim 8, further comprising:
   after forming the active regions
   filling an isolation layer between the active regions.

10. The method for manufacturing the semiconductor structure according to claim 9, wherein
    the isolation layer is partially formed in the gaps.

* * * * *